United States Patent [19]

Onodera et al.

[11] Patent Number: 5,781,142
[45] Date of Patent: Jul. 14, 1998

[54] METHOD AND APPARATUS FOR CONVERTING AN ANALOG MEASUREMENT SIGNAL TO A DIGITAL SIGNAL HAVING REDUCED CONVERSION ERROR

[75] Inventors: Toru Onodera; Tomio Tsunoda, both of Tokyo, Japan

[73] Assignee: Kabushiki Kaisha Toshiba, Kawasaki, Japan

[21] Appl. No.: 584,756

[22] Filed: Jan. 11, 1996

[30] Foreign Application Priority Data

Jan. 11, 1995 [JP] Japan .................................. 7-002919

[51] Int. Cl.[6] .................................................. H03M 1/56
[52] U.S. Cl. ........................ 341/169; 341/128; 341/129; 341/166; 341/170
[58] Field of Search .................................. 341/169, 170, 341/166, 128, 129

[56] References Cited

FOREIGN PATENT DOCUMENTS 6-160534  6/1994  Japan .
6-331750 12/1994  Japan .

OTHER PUBLICATIONS

Glenn Knoll, "Radiation Measurement Handbook," pp. 722–723.

Primary Examiner—Jeffrey A. Gaffin
Assistant Examiner—Jason L. W. Kost
Attorney, Agent, or Firm—Finnegan, Henderson, Farabow, Garrett & Dunner, L.L.P.

[57] ABSTRACT

In a measurement device, a detector output signal indicative of a condition magnitude, e.g., radiation, pressure, temperature, etc. and a ramp signal are added, and the resulting analog summation signal is converted to a digital signal. The digital signal is sampled, integrated, and averaged over a sampling time corresponding to a predetermined sampling number, such as to achieve a condition measurement signal having reduced analog-digital conversion error.

10 Claims, 14 Drawing Sheets

FIG. 1

WIDTH OF N1 = WIDTH OF N2 = WIDTH OF N3 = WIDTH OF N4

FIG. 2

WIDTH OF N4 < WIDTH OF N1 < WIDTH WHEN THERE IS NO
ERROR < WIDTH OF N2 < WIDTH OF N3

METHOD AND APPARATUS FOR CONVERTING AN ANALOG MEASUREMENT SIGNAL TO A DIGITAL SIGNAL HAVING REDUCED CONVERSION ERROR

BACKGROUND OF THE INVENTION

This invention relates to Analog-to-digital conversion and, more particularly, to such conversion of results from a measurement device for radiation, pressure and temperature etc. Application of such conversion to a measurement device results in increased precision of the measurement circuit.

Figure 17:
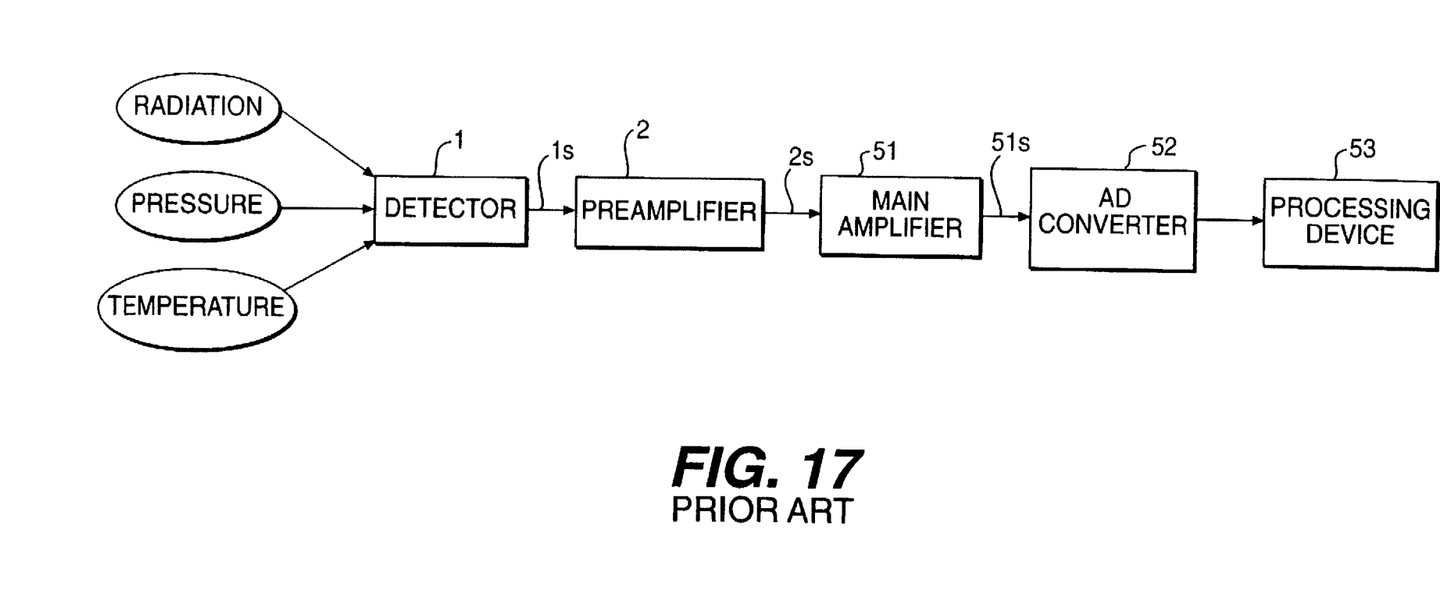
FIG. 17 is a block diagram showing a prior art digital-type measurement device.

Digital processing in the prior art will be described with reference to the block diagram of FIG. 17.

Detector 1 is a detector, such as a radiation detector, pressure sensor, or temperature sensor, etc, that outputs an electrical signal 1S in response to amount of radiation, radiation energy, pressure, or temperature etc. If the distance between detector 1 and a main amplifier 51 is long, or if the waveform of electrical signal 1S is to be shaped to a shape suitable for subsequent signal processing, simple waveform shaping and/or amplification is performed using a preamplifier 2. Preamplifier output signal 2S may be a pulse waveform or a signal close to DC, depending on the type of detector. Main amplifier 51 removes noise from preamplifier output signal 2S to extract the signal components that are the target of measurement, and performs wave shaping adapted to the conversion range and/or speed of conversion of an Analog-to-digital (AD) converter 52. AD converter 52 converts the main amplifier output signal 51S to a digital value by sampling with a suitable timing, and outputs this digital value to processing device 53. Processing device 53 analyses and displays the results of the AD conversion. Conventionally, the output information of various types of sensor are converted in this way to a digital value before being processed.

However, there are the following problems with such digital processing.

1. Precise measurement cannot be achieved due to the presence of errors caused by AD converter 52 itself.
2. The measurement results depend on the precision of the AD converter that is employed, so measurement with higher precision than the precision of currently available AD converters cannot be achieved.

Figure 18:
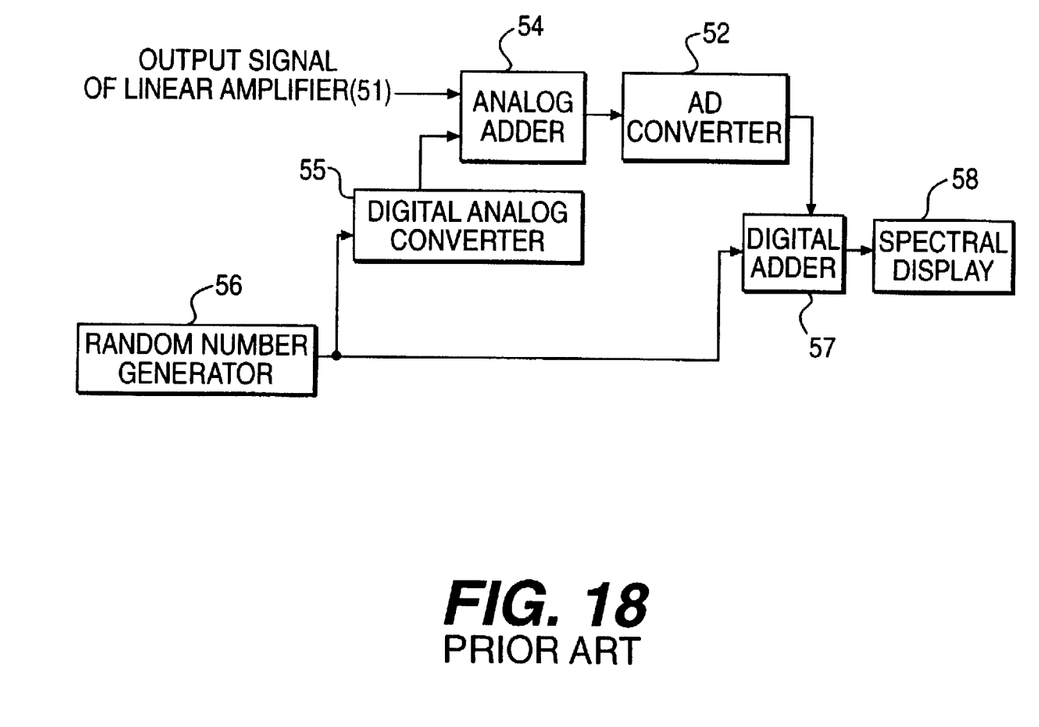
FIG. 18 is a block diagram showing the circuit of a sliding scale method.

In this connection, in order to reduce errors present in the first AD converter itself, as shown in FIG. 18, consideration has been given to adding the following circuitry: a random number generator 56 that generates random numbers, a digital/Analog converter 55 that inputs these random numbers, an Analog adder 54 that inputs the respective output signal of linear amplifier 51 referred to above and digital/Analog converter 55, AD converter 52 that inputs the result of the Analog adder 54, a digital subtractor 57 that provides the difference of the respective output signals of the random number and AD converter 52, and a circuit (based on the sliding scale method) equipped with a spectral display 58 that displays their difference.

However this circuitry is complicated, and difficult to implement. (From "Radiation Measurement Handbook" 2nd Edition, page 722 to 723 by Glenn F Knoll, translated into Japanese by I Kimura and H Sakai).

SUMMARY OF THE INVENTION

It is an object of the invention to provide Analog-to-digital conversion apparatus and method with improved precision.

It is another object of the invention to provide a measurement device which provides measurements such as radiation, pressure, and temperature with improved precision.

DESCRIPTION OF THE PREFERRED EMBODIMENTS

Features of the invention will be described with reference to the graphs of FIGS. 2 to 5.

Figure 2:
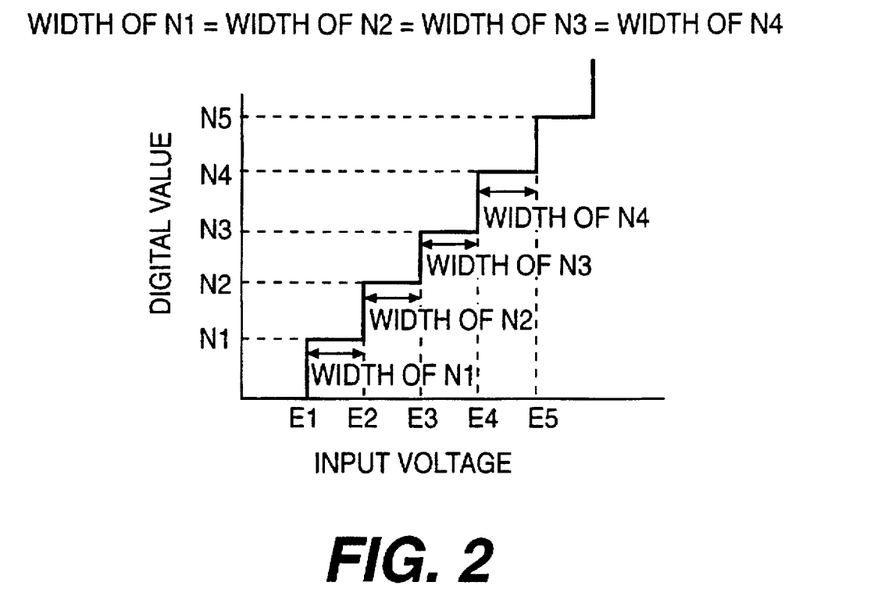
FIG. 2 is a graph showing the relationship between input voltages of a fixed voltage width applied to an AD converter not having a conversion error, and the digital value that is output.

FIG. 2 shows the relationship between the input voltage to an idealized AD converter having no conversion error and the digital value that is output from the AD converter corresponding to this. It is assumed that the input voltage is gradually increased to voltage values E1 to E5 of respective fixed voltage difference (hereinbelow this voltage difference will be called the input voltage width). Under these circumstances, the digital value that is output from the AD converter is a digital value 1011 (=N1) to 1014 (=N5), corresponding to voltage values E1 to E5, if for example the AD converter effects conversion with a precision of 12 bits.

Figure 3:
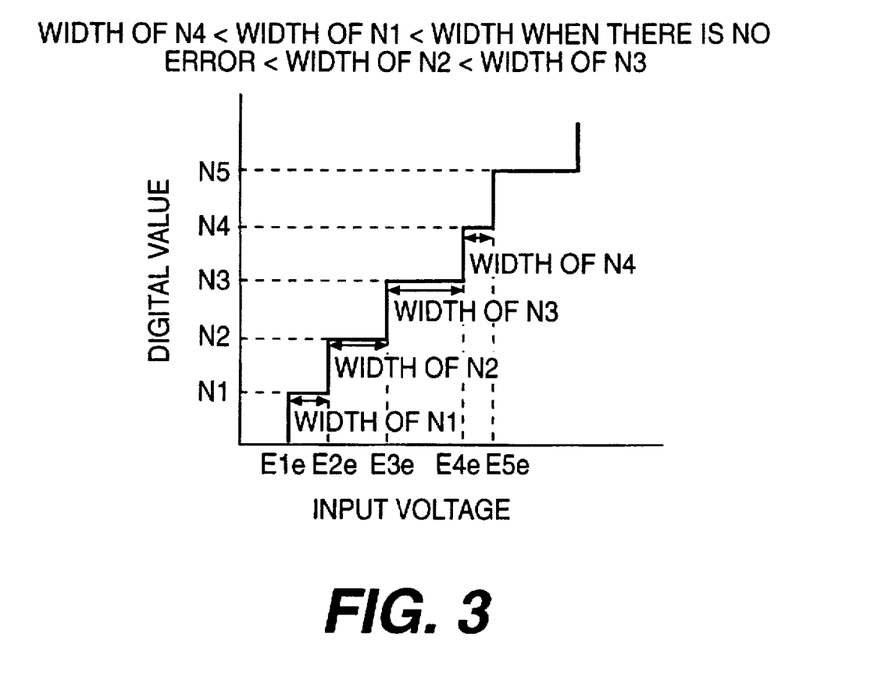
FIG. 3 is a graph showing the relationship between input voltages of fixed voltage width applied to an AD converter having a conversion error, and the digital value that is output.
Figure 4:
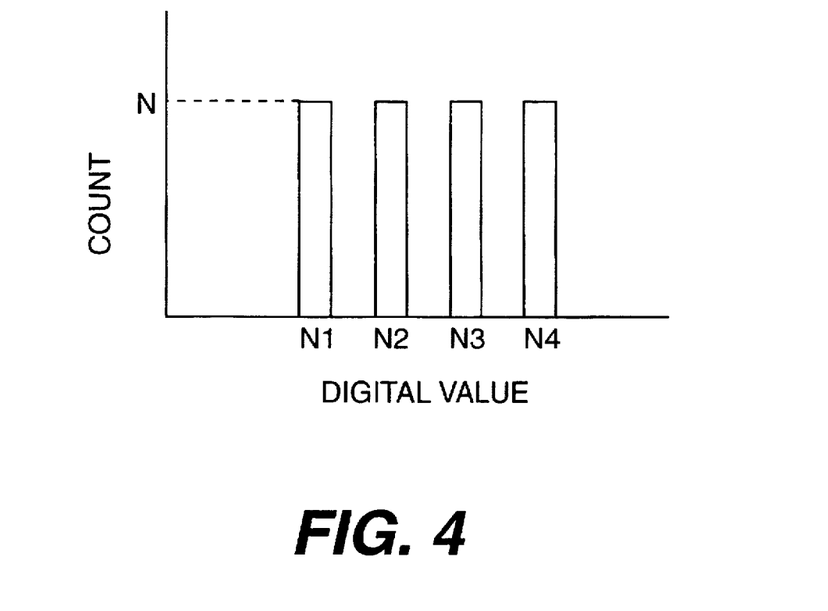
FIG. 4 is a graph showing the digital values and the count values that are counted at each digital value when voltages having a uniform amplitude distribution are applied to an AD converter not having a conversion error.
Figure 5:
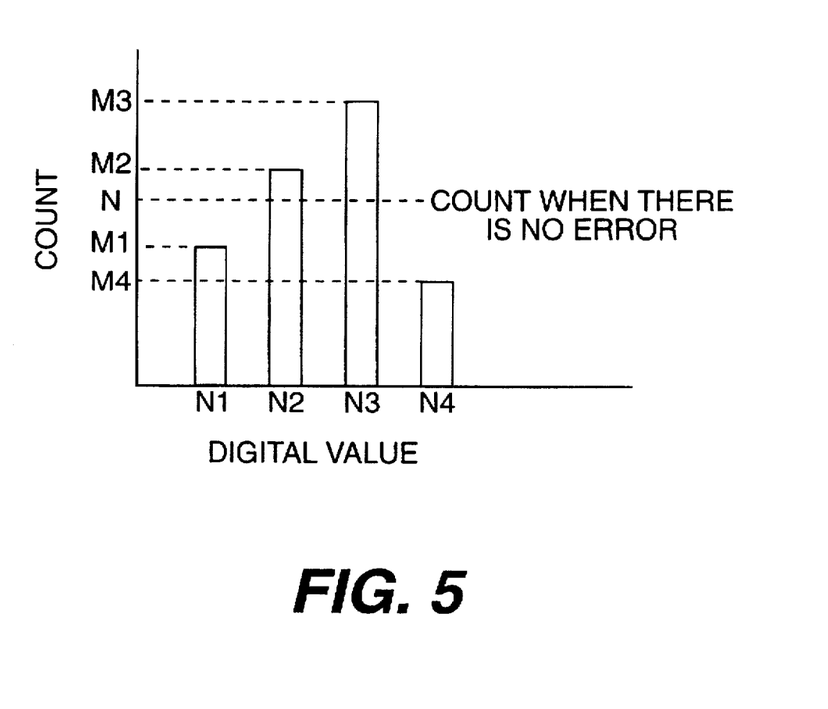
FIG. 5 is a graph showing the digital values and count values that are counted at each digital value when voltages having a uniform amplitude distribution are applied to an AD converter having a conversion error.

However, when input voltages E1 to E5 are applied in this way to an actual AD converter having a conversion error, the digital values that are output from the AD converter are the digital values N1 to N5 as described above, but, due to the conversion error of the AD converter, the width of voltages E1e to E5e corresponding to digital values N1 to N5 vary (see FIG. 3).

This conversion error originates from the AD converter itself and in general may be assumed to be on the order of one-half of the minimum conversion bit of the AD converter, i.e., on the order of ±0.5 LSB (least significant bit) (hereinbelow, the minimum conversion bit of the AD converter will be called the LSB). In the AD converter having an error shown in FIG. 3, compared with an ideal AD converter, the widths (E2e–E1e), (E5e–E4e) of the input voltages corresponding to digital values N1 and N4 are smaller, while the widths (E3e–E2e), (E4e–E3e) of the input voltages corresponding to digital values N2 and N3 are larger.

The frequency distribution obtained by AD conversion, performed a large number of times, on a signal having a uniform probability of existence is considered next. In this case, the number of counts N corresponding to each digital value has to be the same (see FIG. 4); however, since, in an actual AD converter having a conversion error, as shown in FIG. 3, the input voltage widths are different, the counts M1, M4 corresponding to digital values N1, N4 will be smaller than the true count N, while the counts M2, M3 corresponding to digital values N2, N3 will be larger than the true count N (see FIG. 5).

Accordingly, Analog-digital conversion performed in accordance with the present invention makes these different counts as far as possible uniform, utilizing the fact that in general an AD converter has a conversion error of a degree such as does not impair linearity of its specification, and that the total conversion error when error is present on all channels will be zero.

Specifically, in accordance with this invention, the conversion error of the AD converter is spread out over each channel as widely as possible by adding a ramp signal every time an electrical signal to be converted is applied, such as from a detector, then the counts on each channel are added and these added values are averaged over the measurement time.

A radiation pulse height measurement constituting a first embodiment of a measurement device constructed in accordance with the present invention will now be described with reference to the block diagram of FIG. 1.

Figure 1:
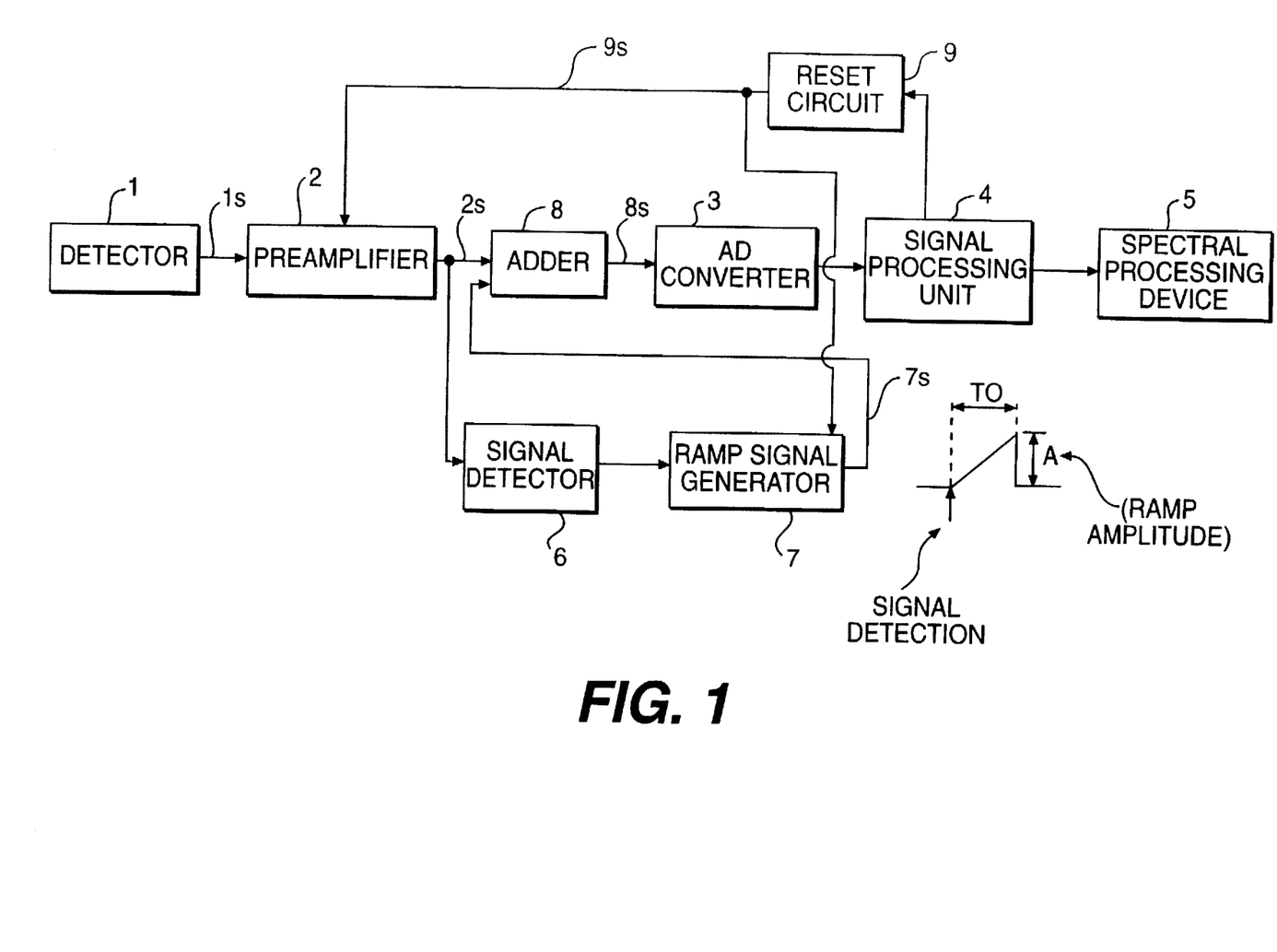
FIG. 1 is a block diagram illustrating a first embodiment of measuring device constructed in accordance with the invention.

In the first embodiment, as shown in FIG. 1, there are provided:

- a radiation detector 1 that responds to incoming radiation by generating a corresponding electric charge;
- a preamplifier 2 that converts the electric charge generated by detector 1 to an electrical signal 2s;
- a signal detector 6 that detects the output signal 2s of the preamplifier 2;
- a ramp signal generator 7 that generates a prescribed ramp signal 7s when a signal is detected by signal detector 6;
- an adder 8 that adds preamplifier output signal 2s and ramp signal 7s;
- an AD converter 3 that performs AD conversion on the signal 8s;
- and provides a sum signal 8s a signal processing unit 4 that integrates the digital values constituting the output signals from AD converter 3 and finds the time-average of these values;
- a reset circuit 9 that inputs from signal processing unit 4 a signal indicating that signal processing has been completed, and that issues a reset signal 9s to preamplifier 2 and ramp signal generator 7;
- and a spectral processing device 5 that holds, analyses and displays the results produced by signal processing unit 4.

The details of how the error originating from the AD converter itself is reduced by forming the input signal to the AD converter 3 (output signal 2s of preamplifier 2+output signal 7s of ramp signal generator 7) will now be described with reference to FIG. 6 to FIG. 8.

Figure 6:
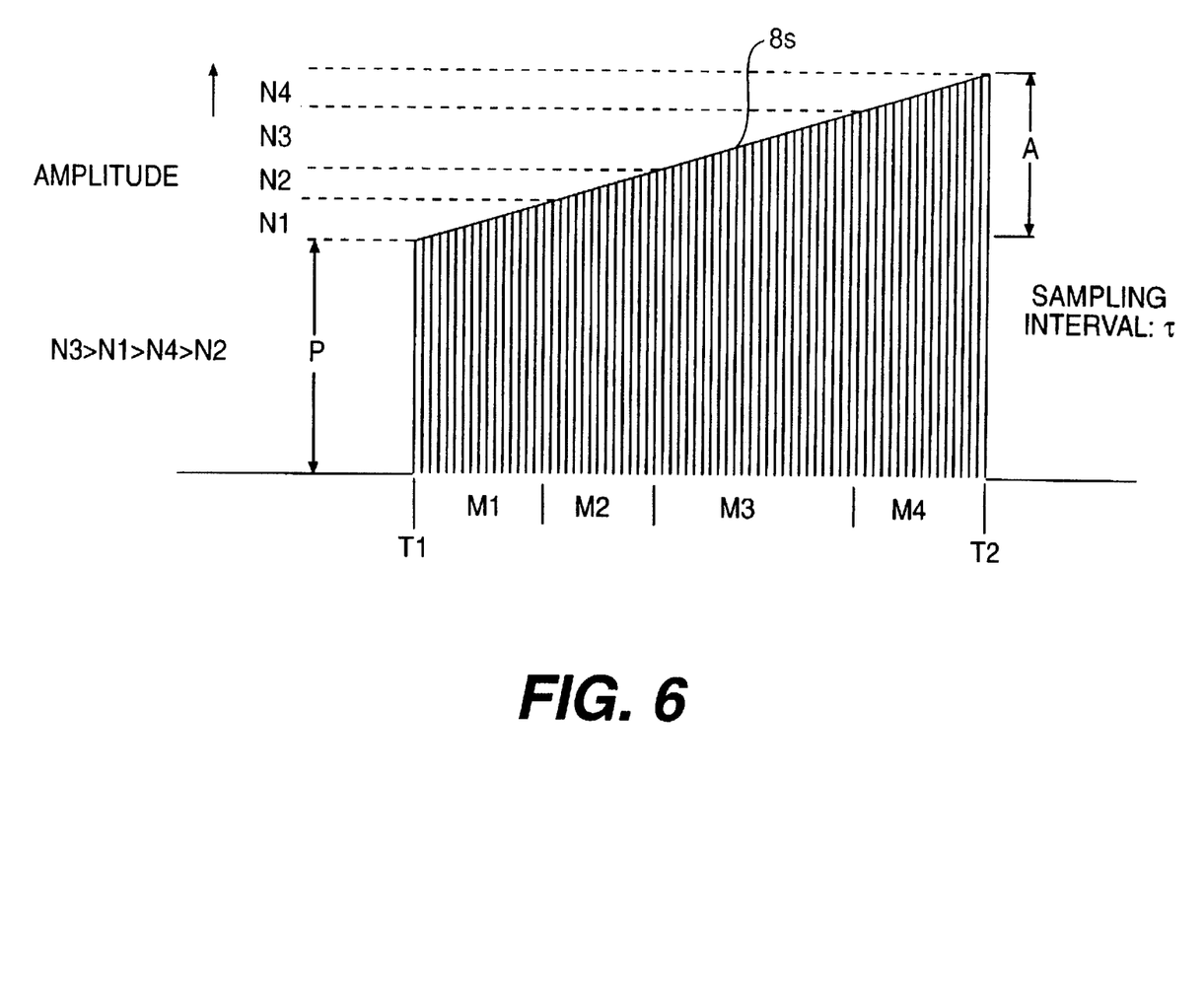
FIG. 6 is a graph showing an output waveform of an adder in FIG. 1 when a ramp signal is applied thereto.

FIG. 6 shows the signal 8s representing the result of the addition process that is output from adder 8. At the time point T1 at which the radiation signal is input, a pulse signal 2s of amplitude P corresponding to the radiation energy is output from preamplifier 2.

This signal 2s is detected by signal detector 6, and a ramp signal 7s is then output, from ramp signal generator 7, whose maximum amplitude is A. Output signal 2s and ramp signal 7s are added by adder 8, generating waveform 8s as shown in FIG. 6. That is, this signal, which was of amplitude P at time point T1, increases with time and, at time point T2, has an amplitude (P+A). This signal is input to AD converter 3, where it is sampled with a sampling interval τ by the AD converter. It is assumed that the error of the AD converter 3 is:

Width of digital value N3>width of digital value N1>width of digital value N4>width of digital value N2.

Thereupon, if the frequency with which thepulse signal 2s having a uniform amplitude distribution is applied to the input terminal of AD converter 3 is directly found without adding to it the ramp signal 7s, as described above, the following relationship between the counts of the values N1–N4 would be observed:

Count of N3>count of N1>count of N4>count of N2.

Figure 7:
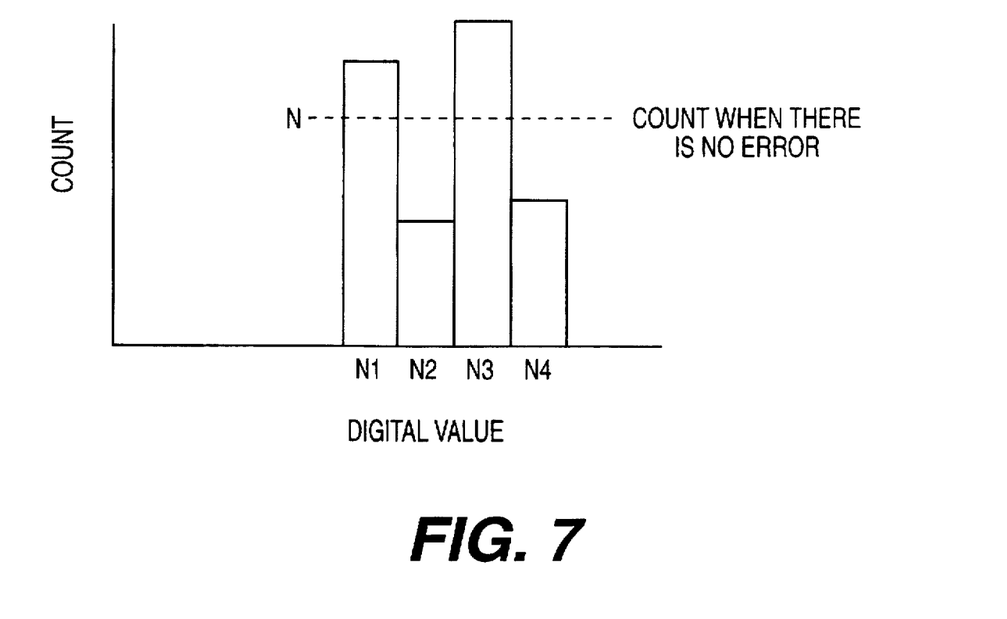
FIG. 7 is a graph showing the digital values that are output from an AD converter and the counts at each digital value when a signal having a uniform distribution is input to the AD converter having a conversion error.
Figure 8:
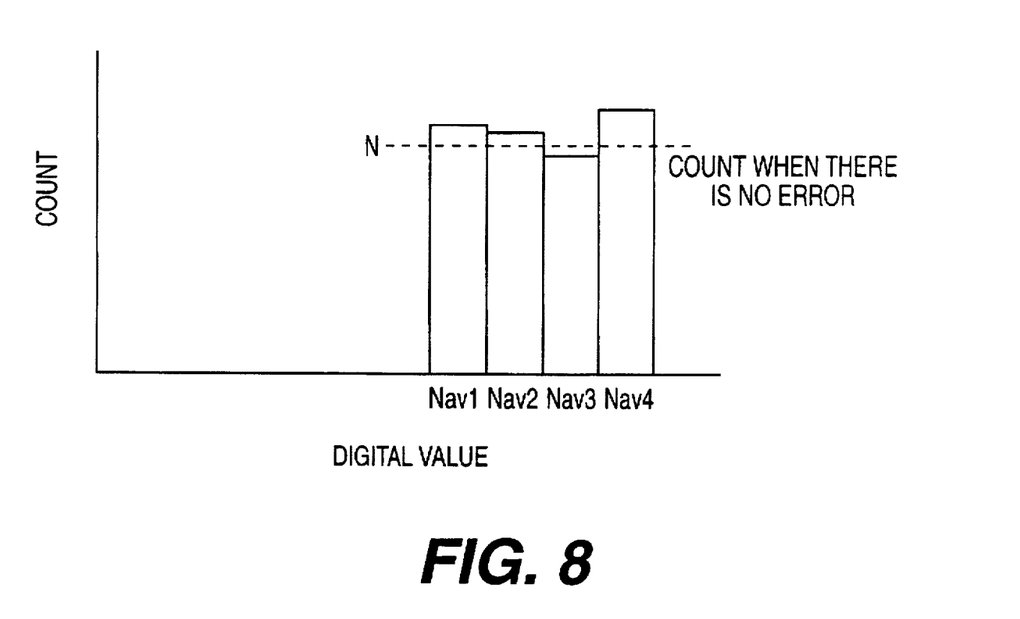
FIG. 8 is a graph showing the digital values and counts at each digital value measured in accordance with the first embodiment.

Differences appear when these values are compared with the count N that would be obtained if the AD converter 3 was without error (see FIG. 7).

Next, the case where ramp signal 7s is added as shown in FIG. 6 will be considered. In this case, sampling is performed with sampling interval τ; in this case, the sampling numbers at digital values N1, N2, N3 and N4 are respectively M1, M2, M3 and M4. The relationship between the respective sampling numbers in this case are:

$$M3 > M1 > M4 > M2.$$

Initially, the digital value between T1 and T2 is integrated in signal processing unit 4. That is, this integrated value NT is:

$$NT = N1 \cdot M1 + N2 \cdot M2 + N3 \cdot M3 + N4 \cdot M4$$

Next, NT is divided by the time over which the integration takes place. Since the time is proportional to the sampling number, if NT is divided by (M1+M2+M3+M4)=M, the mean digital value $N_{AVG}$ is given by the following expression.

$$N_{AVG}=(N1 \cdot M1+N2 \cdot M2+N3 \cdot M3+N4 \cdot M4)/M$$

The sampling numbers M1, M2, M3 and M4 are proportional to the widths of the digital values N1, N2, N3 and N4; since the widths of digital values N1, N2, N3 and N4 are randomly distributed within the range of the error of the AD converter, sampling numbers M1, M2, M3 and M4 are also randomly distributed. Consequently, the variation of the sampling numbers M1, M2, M3 and M4 is centered on a particular fixed value and the scatter of $N_{AVG}$ becomes smaller than when ramp signal 7s is not added; thus, the error originating from the AD converter itself tends to be made smaller (see the respective counts of digital values Nav1 to Nav4 in FIG. 8)

Further, in general, when the maximum amplitude A of the ramp signal 7s and the sum M of sampling numbers become large, the benefit of averaging becomes large, the effect of the error originating from the AD converter itself is decreased and, as a result, the scatter of $N_{AVG}$ becomes small. The reason why $N_{AVG}$ becomes larger when the ramp signal is applied is that a positive ramp signal is applied; if a negative ramp signal were to be applied, $N_{AVG}$ would be smaller than if the ramp signal were not applied.

Figure 9:
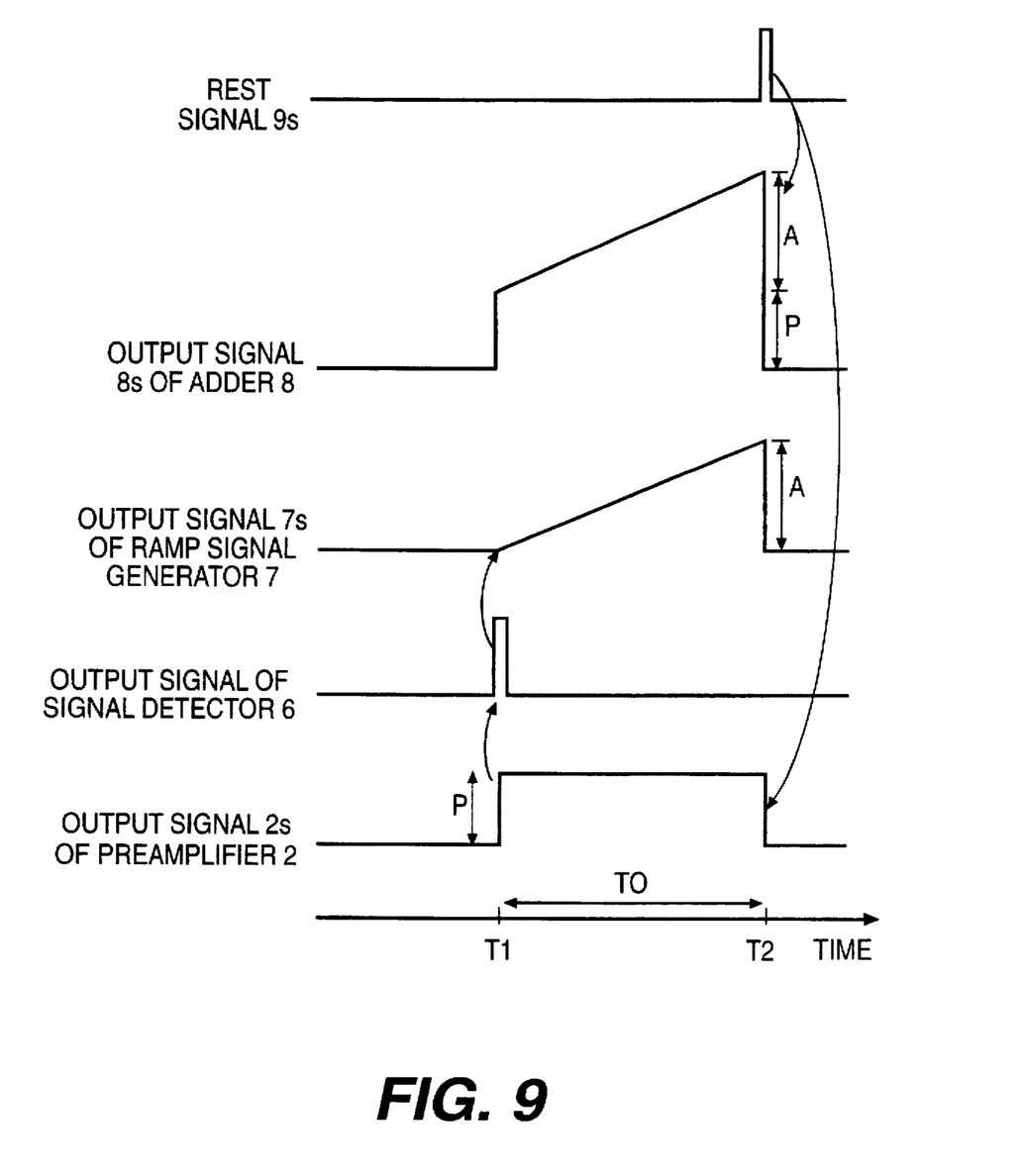
FIG. 9 is a timing chart showing various signals occurring in the device of the first embodiment.

FIG. 9 shows a timing chart in which the change of the above signals is shown in time sequence.

When generation of an output signal 2s by preamplifier 2 is detected, ramp signal generator 7 is triggered to generate a ramp signal 7s of maximum amplitude A and time width T0. Ramp signal 7s and output signal 2s of preamplifier 2 are added by adder 8. The signal 8s representing the sum of the addition performed by adder 8 is subjected to AD conversion by being applied to AD converter 3. Since the input signal of AD converter 3 contains the ramp signal 7s that varies with time, the digital signal, which is the output signal of AD converter 3 also varies with time.

Figure 10:
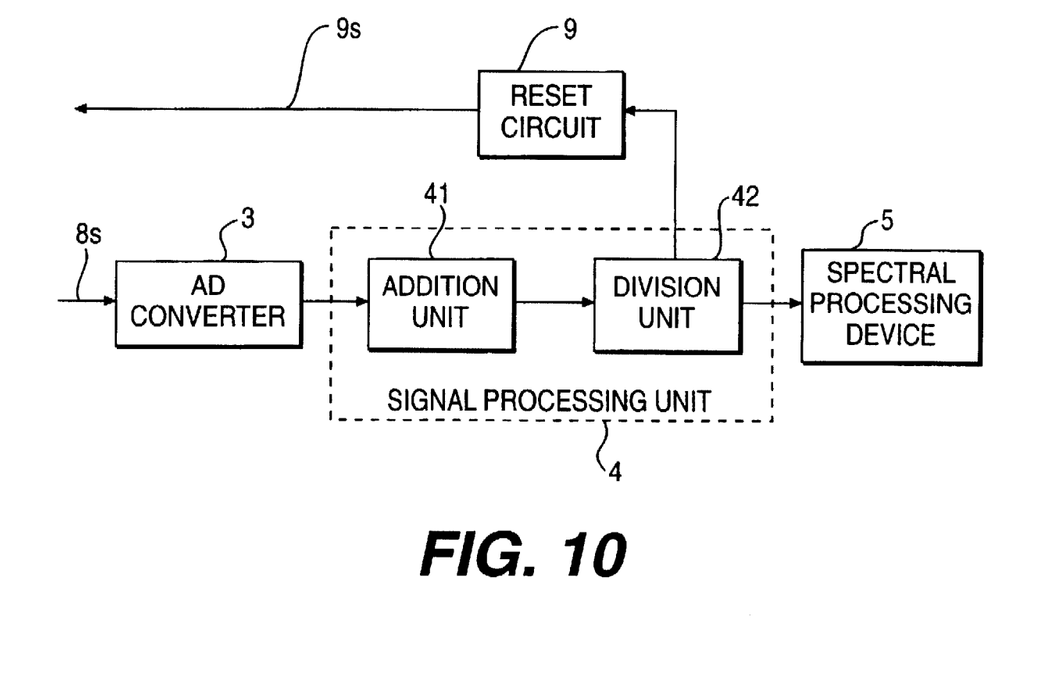
FIG. 10 is a block diagram showing the signal processing unit of the first embodiment.

FIG. 10 illustrates signal processing unit 4 in greater detail. With reference to FIG. 10, an addition unit 41 incorporated in signal processing unit 4 samples with a prescribed sampling period, and integrates the digital value obtained by performing AD conversion from the time point T1 at which output signal 2s is input up to time point T2 at which input of this signal 2s is ceased (=time width T0).

Thus, time width T0 constitutes an integration period. A divider unit 42 incorporated in signal processing unit 4 determines an average by dividing the integrated value by time width T0. This average value is converted to a channel of the energy spectrum, and the count of this channel is incremented by +1. The time width T0 is given by:

$$T0=(\text{sampling period } \tau)\times(\text{sampling number})$$

In general, the decrease in error becomes more significant when the amplitude of the ramp signal has a voltage corresponding to several tens of LSB. As described above, by adding an input signal of wide range to an AD converter 3 in which error exists, the effect of the error originating from the AD converter itself can be reduced since, even though error is present in AD converter 3, this error is averaged.

Thus, even though output signal 2s of preamplifier 2 has a fixed voltage, by addition of ramp signal 7s, which changes with time, to this output signal 2s, the error of the AD converter is averaged over time by spreading it widely over the channels, so, as a result, the error of the AD converter can be reduced.

Thus, in accordance with the first embodiment, the output signal and the ramp signal are added and the result of this addition is converted to a digital value. This digital value is then integrated and its value is averaged over time. Precision is thereby increased, since the Analog/digital conversion error originating from the Analog/digital conversion means is averaged due to the variation of the ramp signal with time.

A second embodiment of a measurement device constructed in accordance with the present invention will be described next.

Figure 11:
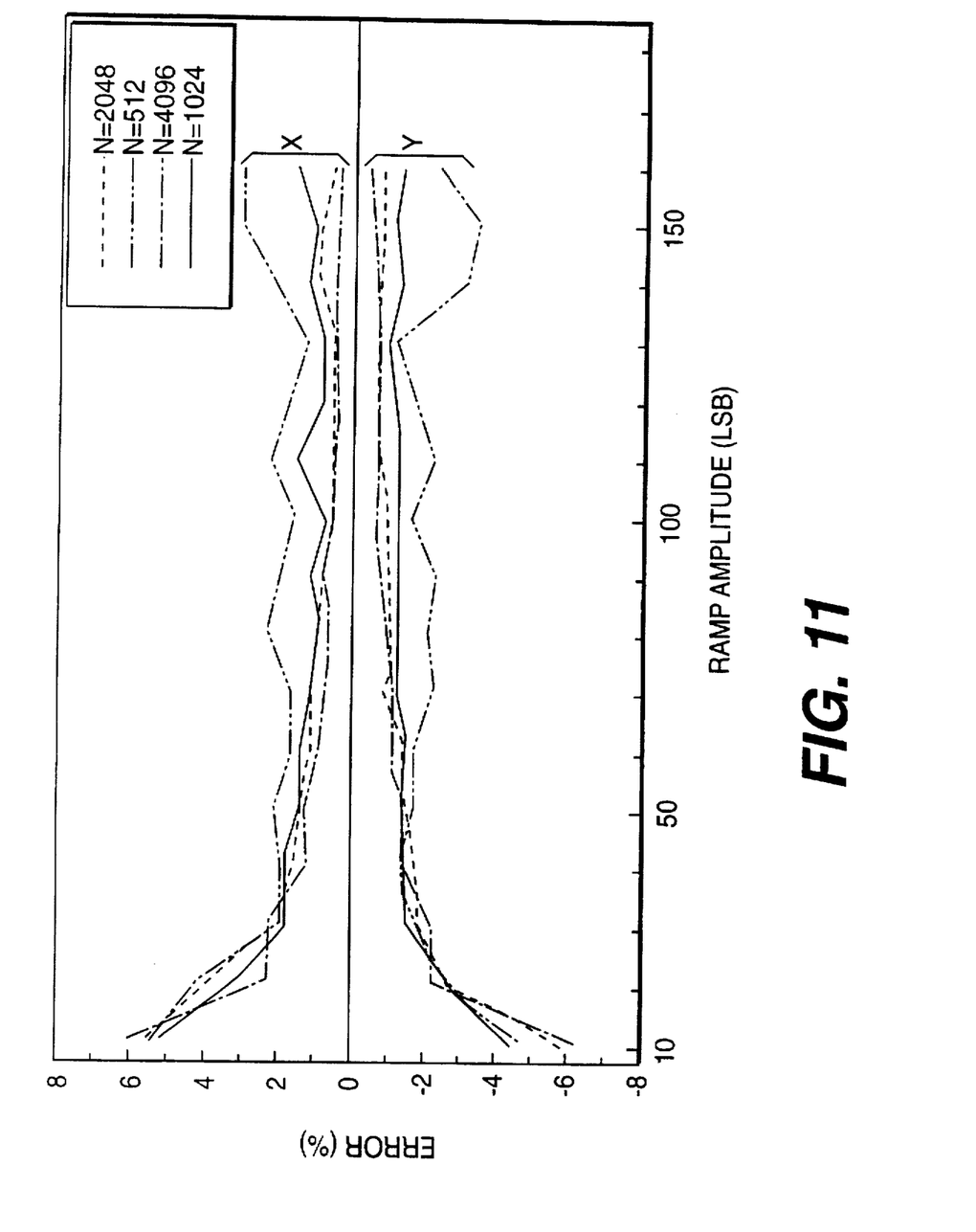
FIG. 11 is a graph showing the maximum amplitude and conversion error of the ramp signal for each sampling number.

Before describing the second embodiment, the relationship between sampling number N and the maximum amplitude A of ramp signal 7s and the conversion error will be described. FIG. 11 is a graph showing the conversion error assuming that a signal having a uniform distribution is input, the sampling number N of the signal processing unit 4 being made is 512, 1024, 2046 and 4095, while, on the other hand, the maximum amplitude A of the ramp signal 7s is made to have a voltage value corresponding to 10 LSB to 160 LSB. FIG. 11 shows, for the count of each channel found at the respective maximum amplitude and sampling number, $X=$(maximum count–average count)/average count and $Y=$(minimum count–average count)/average count It can be seen that conversion error becomes small as these values approach zero. From FIG. 11, it can be seen that the error decreases when the maximum amplitude A of ramp signal 7s is a voltage corresponding to 20 LSB or more. For the same maximum amplitude A, increasing the sampling number N will in general decrease the error, but, since the time width T0 for processing one signal is given by (sampling number×sampling period τ), it the sampling number N is made larger, the time width T0 becomes large, reducing the amount of signal processing per unit time. As a result, the count rate characteristic is adversely affected.

Accordingly, in the second embodiment, the maximum amplitude A of the ramp signal 7s that is output from ramp signal generator 7 shown in the first embodiment is generated to be a voltage corresponding to 20 LSB or more, and the sampling number in signal processing unit 4 is kept below 2048, thereby decreasing the effect of errors originating in the AD converter 3 and, further, keeping the sample number small; a better high count rate characteristic can thereby be obtained.

In a the third embodiment of a measurement device constructed according to the invention, the effect of error originating from the AD converter 3 can be very greatly reduced by making the maximum amplitude A of ramp signal 7s a voltage corresponding to at least 20 LSB, and by making the sampling number in signal processing unit 4 at least 2049. High precision measurement can thereby be achieved.

Figure 12:
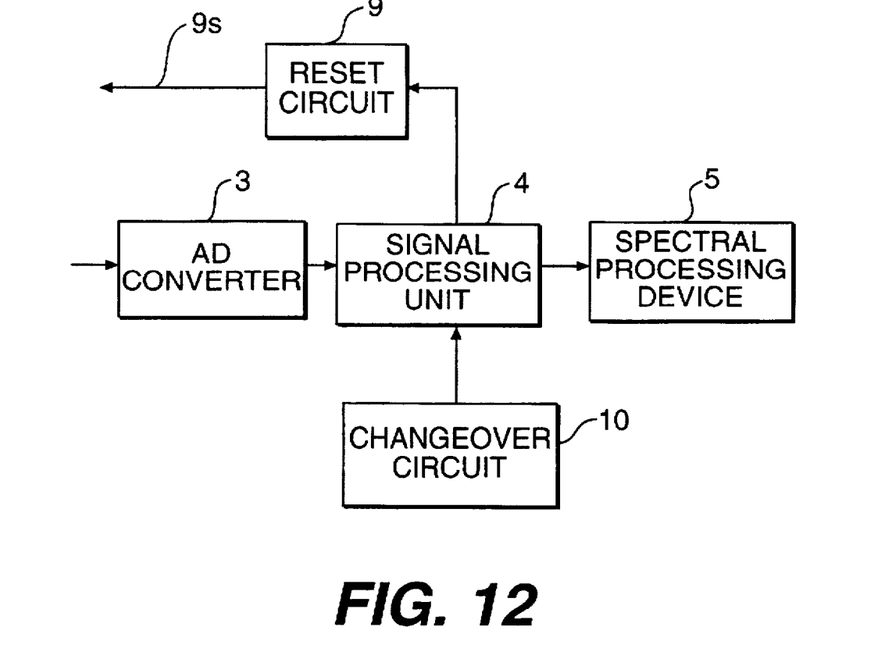
FIG. 12 is a block diagram showing a portion of a measurement device constructed in accordance with a fourth embodiment of the invention.

A fourth embodiment of a measurement device constructed according to the invention is a combination of the second and third embodiments. As shown in the block diagram of FIG. 12, a change over circuit 10 for changing the sampling number is connected to the signal processing unit 4. The maximum amplitude A of ramp signal 7s of ramp signal generator 7 is a voltage corresponding to at least 20 LSB. Regarding changeover circuit 10, if a good high count rate characteristic is desired, this is controlled to provide a sampling number of no more than 2048 to the signal processing unit 4; if high-precision data are required to be obtained, the sampling number is controlled to be 2049 or more.

In this way, measurement can be carried out by changing over appropriately between the case where a high count rate characteristic is to be given most importance and the case where precision is to be given most importance.

Up to this point, cases have been described where an AD converter of high resolution can be employed. Currently, it is possible to manufacture AD converters with a resolution of 12 bits and a sampling period on the order of 30 MHz. However, even higher resolution, for example of the order of 14 bits may be required. Accordingly, in a fifth embodiment of the invention a device is described in which the precision of the results of the AD converter are increased, and in which error originating from the AD converter itself is reduced.

Figure 13:
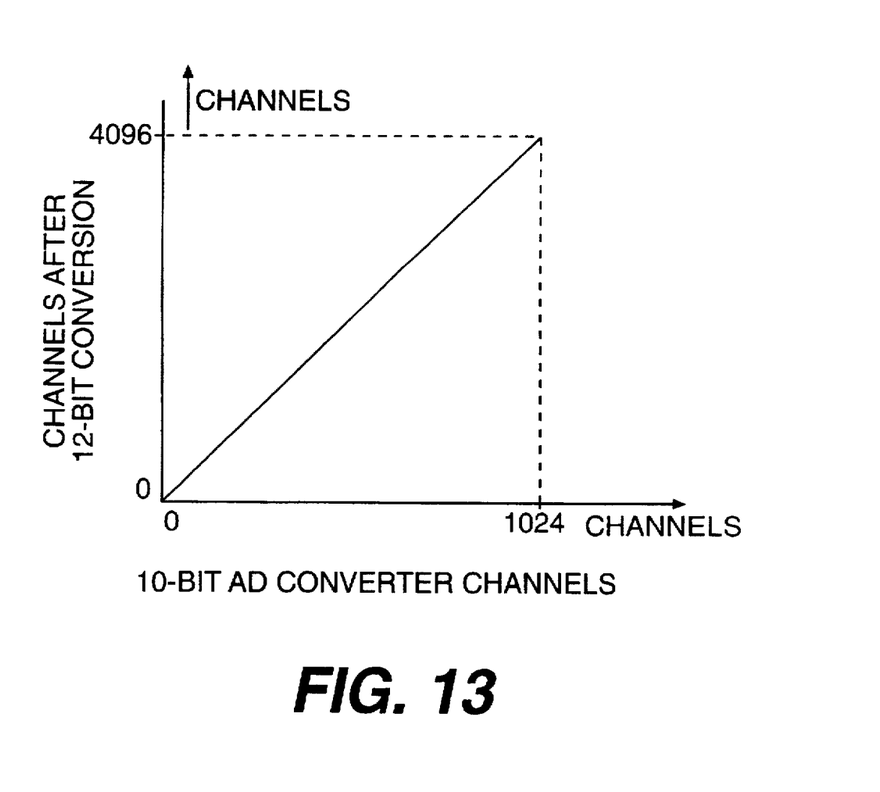
FIG. 13 is a graph showing the channels of a 10-bit AD converter and the channels after conversion to 12 bits, in a fifth embodiment of the invention.

In the fifth embodiment, in order to achieve an m-bit increase of resolution in signal processing unit 4, digital values obtained by AD conversion by AD converter 3 are added by addition unit 41 and the result of this addition is divided in divider 42 by a value equal to the sampling number of the AD converter which is $2^m$. For example, in order to increase the resolution of an AD converter having a 10-bit resolution to 12 bit resolution, m=12−10=2, so the addition result obtained by addition unit 41 is divided by N/4 to obtain a 12-bit resolution as shown in the graph of FIG. 13. In this case also, if error is present in the AD converter itself, precision presents a problem. In this case also, the desired precision can be obtained by suitably setting the sampling number N and maximum amplitude A of the ramp signal 7s just as in the embodiment described previously.

Figure 14:
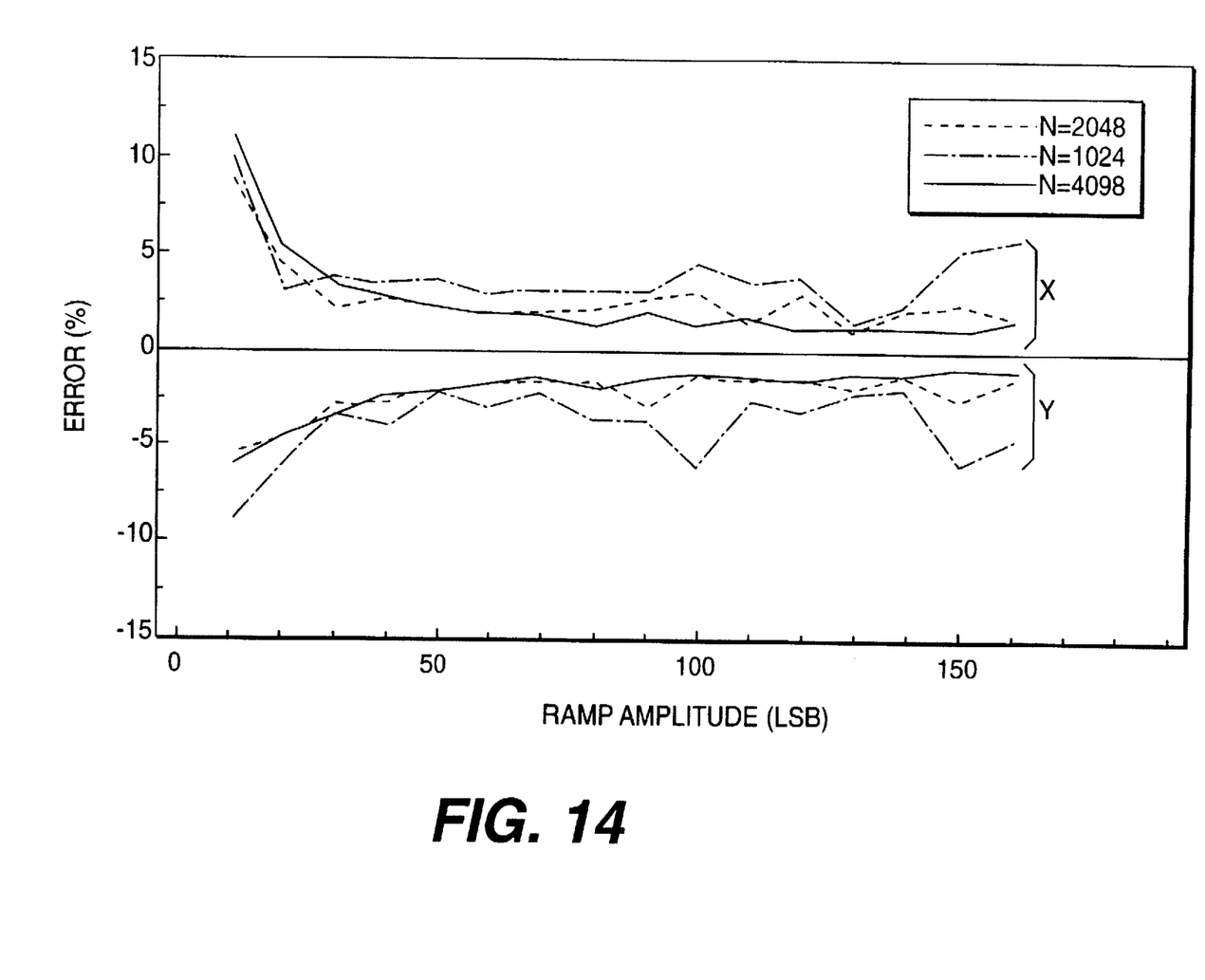
FIG. 14 is a graph showing the maximum amplitude and conversion error of the ramp signal for each sampling number.

FIG. 14 shows the error when an input signal of uniform distribution is applied to the device of the fifth embodiment, the sampling number N being set as 1024, 2046 and 4095 respectively, whereas the maximum amplitude A of the ramp signal 7s is varied between voltages corresponding to 10 LSB and 160 LSB. This shows, for the counts on each channel found at the respective maximum amplitude and sampling number, $X$=(maximum count−average count)/average count and $Y$=(minimum count−average count)/average count It can be seen that the error gets smaller as these values approach zero. It can be seen from FIG. 14 that the error is small when the maximum amplitude A of ramp signal 7s is a voltage corresponding to at least 40 LSB. For the same maximum amplitude A, in general, a larger sampling number N implies a smaller error, but, since the time width T0 for processing a single radiation signal is given by (sampling number N×sampling period τ), if the sampling number N is large, the time width T0 becomes large, so the signal processing amount per unit time becomes low, so the count rate characteristic deteriorates. The case where m=2 was described, but, in general, when raising the resolution by m bits, if the maximum amplitude A of the ramp signal 7s is a voltage corresponding to at least (20×m) LSB, the error of the AD converter itself becomes small.

As described above, by performing suitable calculations in signal processing unit 4 and by suitably selecting the sampling number and amplitude of the ramp signal, the error of the AD converter itself can be reduced and the resolution of the AD converter can simultaneously be raised.

In a sixth embodiment of a measurement device according to the present invention, the maximum amplitude A of the ramp signal 7s shown in the fifth embodiment described above is a voltage corresponding to at least (20×m) LSB and the sampling number is no more than 2048. In this way, the resolution of the AD converter is raised, its error is reduced, and a high count rate characteristic is also obtained.

In a seventh embodiment of a measurement device according to the present invention, the maximum amplitude A of ramp signal 7s shown in the fifth embodiment is a voltage corresponding to (20×m) LSB, and the sampling number is at least 2049. The resolution of the AD converter can thereby be raised and its error greatly reduced. Thus, measurement results of high precision can be achieved.

Figure 15:
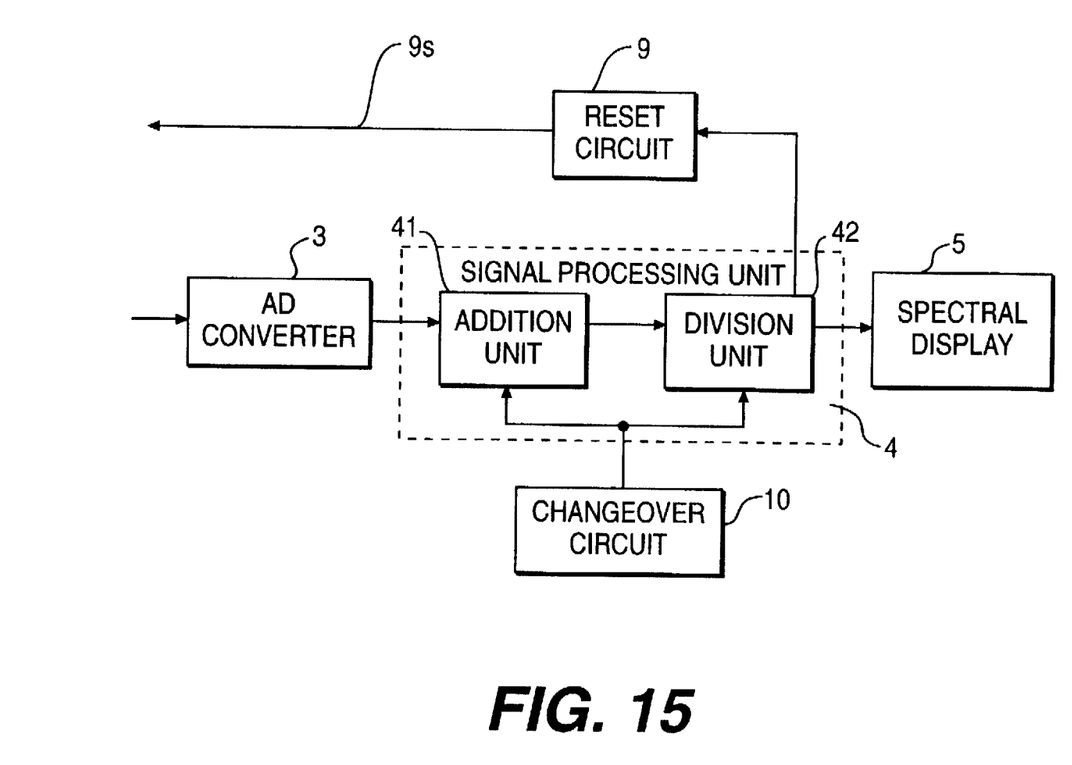
FIG. 15 is a block diagram showing a portion of a measurement device constructed in accordance with an eighth embodiment of the invention.

An eighth embodiment of a measuring device according to the present invention is a combination of embodiment six and embodiment seven described above. As shown by the block diagram of FIG. 15, a changeover circuit 10 for changing the sampling number is connected to signal processing unit 4. The maximum amplitude A of ramp signal 7s of ramp signal generator 7 is a voltage corresponding to (20×m) LSB or more. If measurement is to be performed in which a high count rate characteristic is the first consideration, changeover circuit 10 is controlled such that the sampling number at signal processing unit 4 is no more than 2048; if measurement is to be performed such that high precision is the first consideration, switching circuit 10 performs control such that the sampling number at signal processing unit 4 is at least 2049.

Thus, it is possible to select whether measurement is to be performed in which the first consideration is a suitable high count rate characteristic, or measurement is to be performed in which the first consideration is high precision, in a condition in which the resolution of the AD converter is increased.

Figure 16:
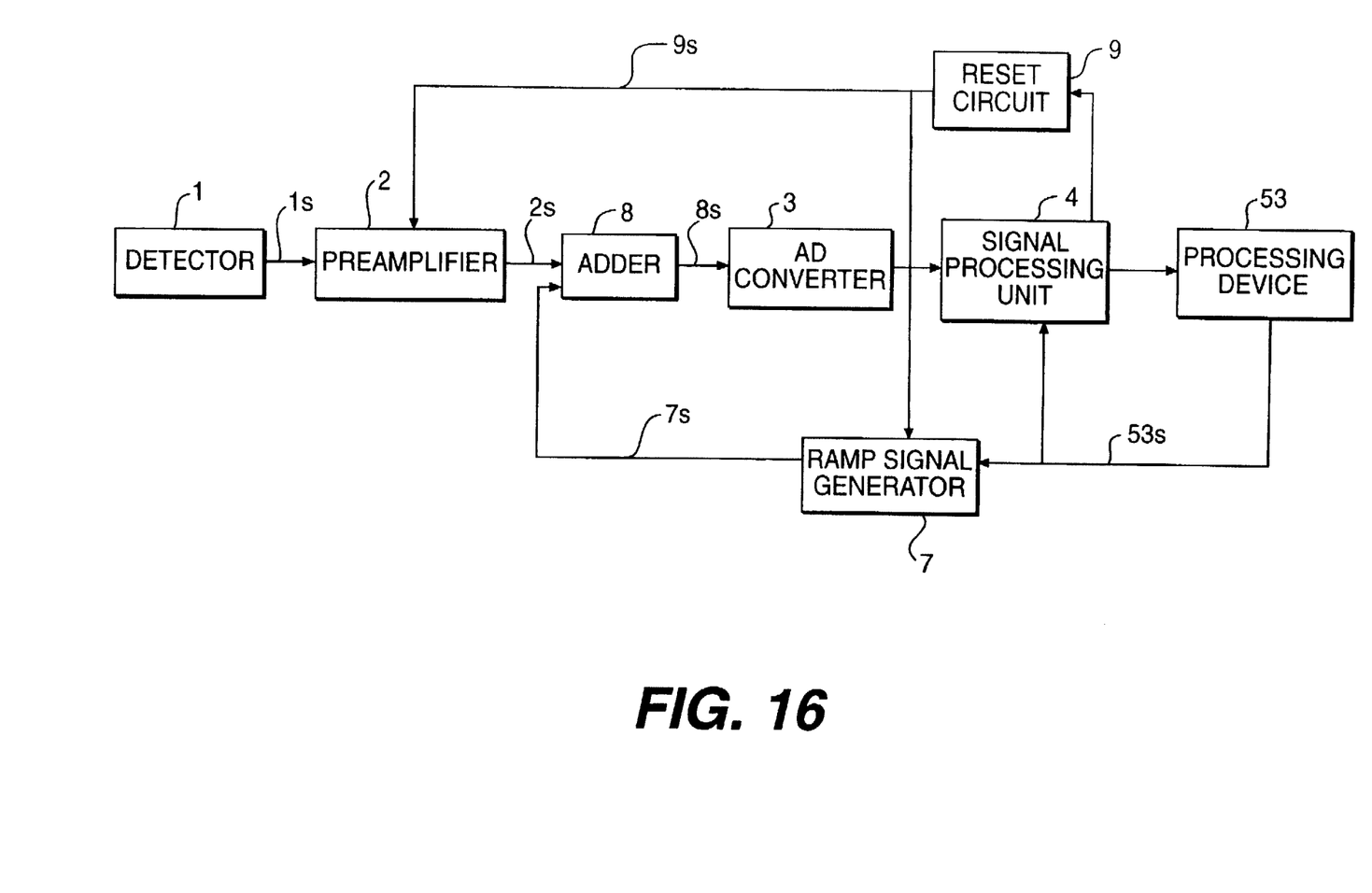
FIG. 16 is a block diagram illustrating a ninth embodiment of measuring device constructed in accordance with the invention.

Up to this point, the embodiments have been concerned with measurement of radiation pulse height. However, detector 1 in FIG. 16 could instead provide on electrical signal 1S as a DC signal as in the case of measuring pressure or temperature as a ninth embodiment. When the change of preamplifier output signal 2S is small, processing device 5 outputs a timing signal, generates a ramp signal 7S, and initiates the operation of signal processing unit 4. It is thereby possible to measure pressure and/or temperature etc. at an arbitrary time point, and the benefits of this invention can be obtained in exactly the same way as in the case of radiation pulse height measurement.

Furthermore, a description has been provided for the case in which a positive ramp signal is applied. However, the same effect can be obtained by adding a negative ramp signal. Further, the same effect can be obtained by applying any signal having a uniform or close to uniform distribution, such as a triangular wave, saw teeth wave, or sine wave.

Additional advantages and modifications will readily occur to those skilled in the art. The invention in its broader aspects is therefore not limited to the specific details, representative apparatus and method, and illustrative examples shown and described. Accordingly, departures may be made from such details without departing from the spirit or scope of the general inventive concept. Thus, it is intended that this invention cover the modifications and variations of the invention provided they are within the scope of the appended claims and their equivalents.

What is claimed is:

1. A measurement device comprising:
   detection means for outputting an electrical signal indicative of a condition magnitude;
   means for generating a ramp signal;
   means for adding said electrical signal and said ramp signal and for outputting a sum signal to an analog/digital conversion means for converting said sum signal to a digital signal; and
   signal processing means for integrating said digital signal and for determining an average digital value of said digital signal by dividing the integrated digital signal by a corresponding integration period, said average digital value indicative of the condition magnitude.

2. The measurement device according to claim 1, wherein, to increase by m bits (where m is a positive integer) a resolution of said analog/digital conversion means, said signal processing means divides the integrated digital value by $2^m$.

3. The measurement device according to claim 2, wherein said ramp signal generating means has a maximum ramp signal voltage amplitude of at least (20×m) an analog voltage corresponding to a least significant bit of said analog/digital conversion means, and wherein said signal processing means samples said digital value no more than 2048 times.

4. The measurement device according to claim 1, wherein said ramp signal generating means has a maximum ramp signal amplitude of at least 20 times an analog voltage corresponding to a least significant bit of said analog/digital conversion means, and wherein said signal processing means samples said digital value no more than 2048 times.

5. The measurement device according to claim 1, wherein said ramp signal generating means has a maximum ramp signal amplitude of at least 20 times an analog voltage corresponding to a least significant bit of said analog/digital conversion means, and wherein said signal processing means samples said digital value at least 2049 times.

6. The measurement device according to claim 1, wherein said signal processing means samples said digital value that no more than 2048 times for normal precision measurement, and wherein said measurement device further includes:

a changeover means for changing a sampling number of said signal processing means to at least 2049 times when performing high precision measurement, wherein said ramp signal generating means has a maximum ramp signal voltage amplitude of at least 20 times said analog voltage corresponding to a least significant bit of said analog/digital conversion means.

7. The measurement device according to claim 2, wherein said ramp signal generating means has a maximum ramp signal voltage amplitude of at least (20×m) an analog voltage corresponding to a least significant bit of said analog/digital conversion means, and wherein said signal processing means samples said digital value at least 2049 times.

8. The measurement device according to claim 2, wherein said signal processing means samples said digital value no more than 2048 times for normal precision measurement, and wherein said measurement device further includes changeover means for changing a sampling number of said signal processing means to at least 2049 times when performing high precision measurement, wherein said ramp signal generating means has a maximum ramp signal voltage amplitude of at least (20×m) an analog voltage corresponding to a least significant bit of said analog/digital conversion means.

9. A method for providing a digital representation of an analog measurement, comprising the steps of:

outputting an analog electrical signal indicative of a condition magnitude;

generating a ramp signal;

adding said electrical signal and said ramp signal to provide a sum signal;

converting said sum signal to a digital signal;

integrating said digital signal over an integration period; and dividing the integrated digital signal by said integration period to produce a digital measurement signal indicative of the condition magnitude.

10. The method according to claim 9, wherein the generating steps includes a step of generating the ramp signal up to a maximum voltage amplitude of at least 20 times an analog voltage corresponding to a least significant bit of said digital signal.

* * * * *